United States Patent
Young et al.

(10) Patent No.: US 10,811,516 B2
(45) Date of Patent: Oct. 20, 2020

(54) STRUCTURE AND FORMATION METHOD OF SEMICONDUCTOR DEVICE STRUCTURE WITH GATE STACK

(71) Applicant: Taiwan Semiconductor Manufacturing Company, Ltd., Hsinchu (TW)

(72) Inventors: Bo-Feng Young, Hsinchu (TW); Che-Cheng Chang, New Taipei (TW); Mu-Tsang Lin, Hemei Township (TW); Tung-Wen Cheng, New Taipei (TW); Zhe-Hao Zhang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/230,453

(22) Filed: Dec. 21, 2018

(65) Prior Publication Data
US 2019/0123168 A1 Apr. 25, 2019

Related U.S. Application Data

(63) Continuation of application No. 14/801,447, filed on Jul. 16, 2015, now Pat. No. 10,164,050.

(51) Int. Cl.
*H01L 21/336* (2006.01)
*H01L 29/66* (2006.01)
(Continued)

(52) U.S. Cl.
CPC .... *H01L 29/66545* (2013.01); *H01L 29/4966* (2013.01); *H01L 29/4983* (2013.01);
(Continued)

(58) Field of Classification Search
CPC ..... H01L 21/823468; H01L 21/823418; H01L 29/6653; H01L 29/6656
See application file for complete search history.

(56) References Cited

U.S. PATENT DOCUMENTS

| | | |
|---|---|---|
| 5,811,342 A | 9/1998 | Wu |
| 5,814,537 A | 9/1998 | Maa et al. |

(Continued)

FOREIGN PATENT DOCUMENTS

| | | |
|---|---|---|
| CN | 1770407 A | 5/2006 |
| CN | 101997032 A | 3/2011 |

(Continued)

*Primary Examiner* — George R Fourson, III
(74) *Attorney, Agent, or Firm* — Slater Matsil, LLP

(57) ABSTRACT

Structures and formation methods of a semiconductor device structure are provided. The semiconductor device structure includes a semiconductor substrate and a gate electrode over the semiconductor substrate. The semiconductor device structure also includes a source/drain structure adjacent to the gate electrode. The semiconductor device structure further includes a spacer element over a sidewall of the gate electrode, and the spacer element has an upper portion having a first exterior surface and a lower portion having a second exterior surface. Lateral distances between the first exterior surface and the sidewall of the gate electrode are substantially the same. Lateral distances between the second exterior surface and the sidewall of the gate electrode increase along a direction from a top of the lower portion towards the semiconductor substrate.

20 Claims, 5 Drawing Sheets

Related U.S. Application Data

(60) Provisional application No. 62/096,745, filed on Dec. 24, 2014.

(51) Int. Cl.
    H01L 29/78 (2006.01)
    H01L 29/49 (2006.01)
    *H01L 21/8234* (2006.01)

(52) U.S. Cl.
    CPC .... H01L 29/6656 (2013.01); H01L 29/66636 (2013.01); H01L 29/78 (2013.01); *H01L 21/823418* (2013.01); *H01L 21/823468* (2013.01); *H01L 29/6653* (2013.01)

(56) References Cited

U.S. PATENT DOCUMENTS

| | | | |
|---|---|---|---|
| 6,815,320 B2 | 11/2004 | Kim et al. | |
| 7,648,924 B2* | 1/2010 | Wei | H01L 21/0212 |
| | | | 438/778 |
| 8,384,167 B2 | 2/2013 | Kikuchi et al. | |
| 8,928,094 B2* | 1/2015 | Cheng | H01L 21/26586 |
| | | | 257/408 |
| 9,312,376 B2* | 4/2016 | Kim | H01L 29/4966 |
| 9,431,516 B2* | 8/2016 | Zhao | H01L 29/66598 |
| 10,546,956 B2* | 1/2020 | Zhang | H01L 29/6653 |
| 2007/0034963 A1 | 2/2007 | Sudo | |
| 2007/0080387 A1 | 4/2007 | Liu et al. | |
| 2007/0252221 A1 | 11/2007 | Ohta | |
| 2007/0267703 A1* | 11/2007 | Chong | H01L 29/66628 |
| | | | 257/368 |
| 2009/0032880 A1* | 2/2009 | Kawaguchi | H01L 29/66636 |
| | | | 257/369 |
| 2009/0101942 A1* | 4/2009 | Dyer | H01L 29/6653 |
| | | | 257/288 |
| 2009/0174002 A1* | 7/2009 | Ouyang | H01L 29/6659 |
| | | | 257/369 |
| 2009/0250771 A1* | 10/2009 | Miyamura | H01L 29/105 |
| | | | 257/402 |
| 2010/0038687 A1 | 2/2010 | Klaus et al. | |
| 2011/0003450 A1* | 1/2011 | Lee | H01L 29/78 |
| | | | 438/285 |
| 2011/0147812 A1 | 6/2011 | Steigerwald et al. | |
| 2011/0212604 A1 | 9/2011 | Yang et al. | |
| 2011/0284935 A1 | 11/2011 | Yamada | |
| 2012/0049247 A1 | 3/2012 | Lee et al. | |
| 2012/0086048 A1 | 4/2012 | Park et al. | |
| 2013/0122676 A1 | 5/2013 | Jeng | |
| 2014/0021517 A1 | 1/2014 | Cheng et al. | |
| 2014/0197455 A1* | 7/2014 | Lee | H01L 29/66545 |
| | | | 257/192 |
| 2014/0217421 A1* | 8/2014 | Zhu | H01L 29/66636 |
| | | | 257/77 |
| 2015/0064835 A1 | 3/2015 | Moschner et al. | |
| 2015/0108546 A1* | 4/2015 | Murthy | H01L 21/823807 |
| | | | 257/192 |
| 2016/0086945 A1 | 3/2016 | Liu | |
| 2016/0087037 A1* | 3/2016 | Cheng | H01L 21/823814 |
| | | | 257/392 |
| 2017/0221767 A1* | 8/2017 | Posseme | H01L 29/78618 |
| 2020/0020771 A1* | 1/2020 | Chen | H01L 29/165 |
| 2020/0105875 A1* | 4/2020 | Li | H01L 21/823425 |

FOREIGN PATENT DOCUMENTS

| | | |
|---|---|---|
| CN | 105789275 A | 7/2016 |
| KR | 1020090044050 A | 5/2009 |
| KR | 1020120036185 A | 4/2012 |

* cited by examiner

STRUCTURE AND FORMATION METHOD OF SEMICONDUCTOR DEVICE STRUCTURE WITH GATE STACK

PRIORITY CLAIM AND CROSS-REFERENCE

This Application is a continuation of U.S. application Ser. No. 14/801,447, filed on Jul. 16, 2015, which claims the benefit of U.S. Provisional Application No. 62/096,745, filed on Dec. 24, 2014, which applications are incorporated by reference herein in their entireties.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling down process generally provides benefits by increasing production efficiency and lowering associated costs. However, these advances have increased the complexity of processing and manufacturing ICs.

Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
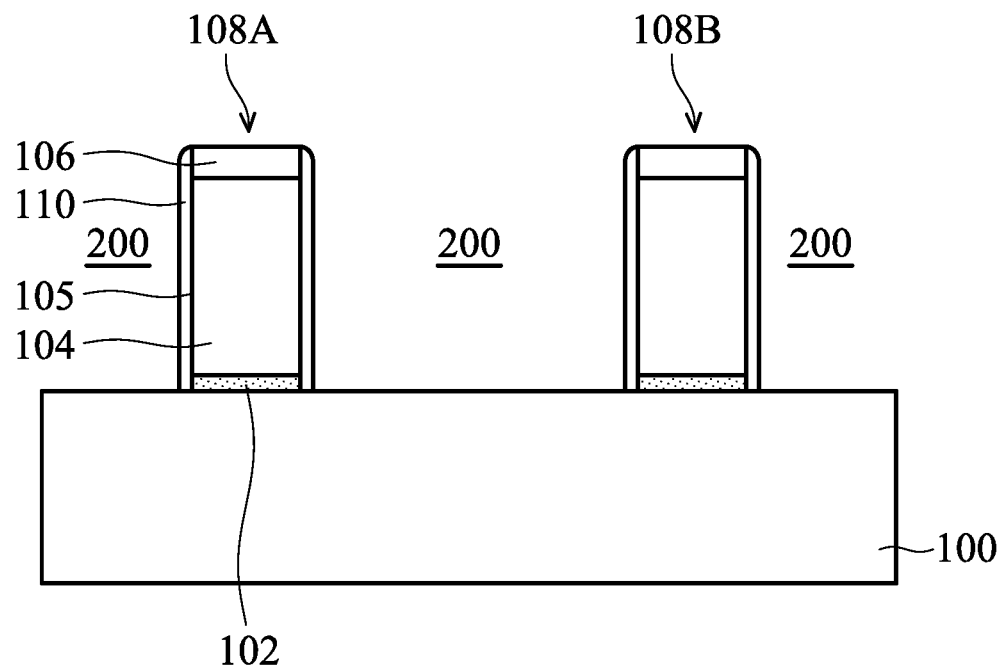
FIGS. 1A-1I are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1I are cross-sectional views of various stages of a process for forming a semiconductor device structure, in accordance with some embodiments. Additional operations can be provided before, during, and/or after the stages described in FIGS. 1A-1I. Some of the stages that are described can be replaced or eliminated for different embodiments. Additional features can be added in the semiconductor device structure. Some of the features described below can be replaced or eliminated for different embodiments.

As shown in FIG. 1A, a semiconductor substrate 100 is provided. In some embodiments, the semiconductor substrate 100 is a bulk semiconductor substrate, such as a semiconductor wafer. For example, the semiconductor substrate 100 is a silicon wafer. The semiconductor substrate 100 may include silicon or other elementary semiconductor materials such as germanium. In some other embodiments, the semiconductor substrate 100 includes a compound semiconductor. The compound semiconductor may include gallium arsenide, silicon carbide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, shallow trench isolation (STI) features or local oxidation of semiconductor (LOCOS) features.

Examples of the various device elements that may be formed in the semiconductor substrate 100 include transistors, diodes, another suitable element, or a combination thereof. The transistors may include metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs). Various processes may be performed to form the various device elements. The processes include, for example, deposition, photolithography, etching, implantation, annealing, planarization, another applicable process, or a combination thereof.

As shown in FIG. 1A, a number of gate stacks including gate stacks 108A and 108B are formed over the semiconductor substrate 100, in accordance with some embodiments. In some embodiments, each of the gate stacks 108A and 108B includes a gate dielectric layer 102 and a gate electrode 104. In some embodiments, each of the gate stacks 108A and 108B includes a hard mask 106. The hard mask 106 is used to assist in the formation of the gate stacks 108A and 108B. In some embodiments, the hard mask 106 is made of silicon oxide, silicon nitride, silicon oxynitride, silicon carbide, silicon carbon nitride, another suitable material, or a combination thereof. In some embodiments, the hard mask 106 has a multi-layer structure. There are recesses 200 between the gate stacks, as shown in FIG. 1A. In some embodiments, the recesses 200 are trenches. Since feature sizes continue to decrease, the width of each of the recesses 200 is getting smaller and smaller.

In some embodiments, the gate dielectric layer 102 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 102 is a dummy gate dielectric layer which will be removed in a subsequent process. The dummy gate dielectric layer is, for example, a silicon oxide layer.

In some embodiments, the gate electrode 104 includes polysilicon, a metal material, another suitable conductive material, or a combination thereof. In some embodiments, the gate electrode 104 is a dummy gate electrode layer and will be replaced with another conductive material such as a metal material. The dummy gate electrode layer is made of, for example, polysilicon.

In some embodiments, a gate dielectric material and a gate electrode layer are deposited over the semiconductor substrate 100. In some embodiments, the gate dielectric material and the gate electrode layer are sequentially deposited by using suitable deposition methods. The suitable deposition methods may include a chemical vapor deposition (CVD) process, an atomic layer deposition (ALD) process, a thermal oxidation process, a physical vapor deposition (PVD) process, another applicable process, or a combination thereof. Afterwards, with the assistance of the hard mask 106, the gate dielectric material and the gate electrode layer are patterned to form the gate stacks including the gate stacks 108A and 108B. In some embodiments, an interfacial layer is formed between the gate dielectric layer and the semiconductor substrate.

Afterwards, sealing elements 110 are formed over sidewalls of the gate stack 108A and 108B, as shown in FIG. 1A in accordance with some embodiments. In some embodiments, the sealing elements 110 are in direct contact with sidewalls 105 of the gate electrodes 104. The sealing elements 110 may be used to protect the gate electrodes 104 from damage while subsequent process operations are performed. The sealing elements 110 may also be used as a mask during a subsequent ion implantation operation.

In some embodiments, the sealing elements 110 are made of a dielectric material. The dielectric material may include silicon oxide, silicon oxynitride, silicon nitride, another suitable material, or a combination thereof. In some embodiments, a sealing material layer is deposited over the gate stacks 108A and 108B and the semiconductor substrate 100. The sealing material layer may be deposited using a CVD process, an ALD process, an oxidation process, a spin-on process, another applicable process, or a combination thereof. Afterwards, an etching process, such as a dry etching process, is performed to partially remove the sealing material layer. The remaining portions of the sealing material layer on the opposite sidewalls of the gate stacks 108A and 108B form the sealing elements 110, as shown in FIG. 1A.

In some embodiments, one or more ion implantation operations are performed to form light doped source and drain (LDS/D) regions (not shown) on opposite sides of the gate stacks 108A and 108B in the semiconductor substrate 100. Many variations and/or modifications can be made to embodiments of the disclosure. In some embodiments, the LDS/D regions are not formed. In some embodiments, the sealing elements 110 are not formed.

Figure 1B:
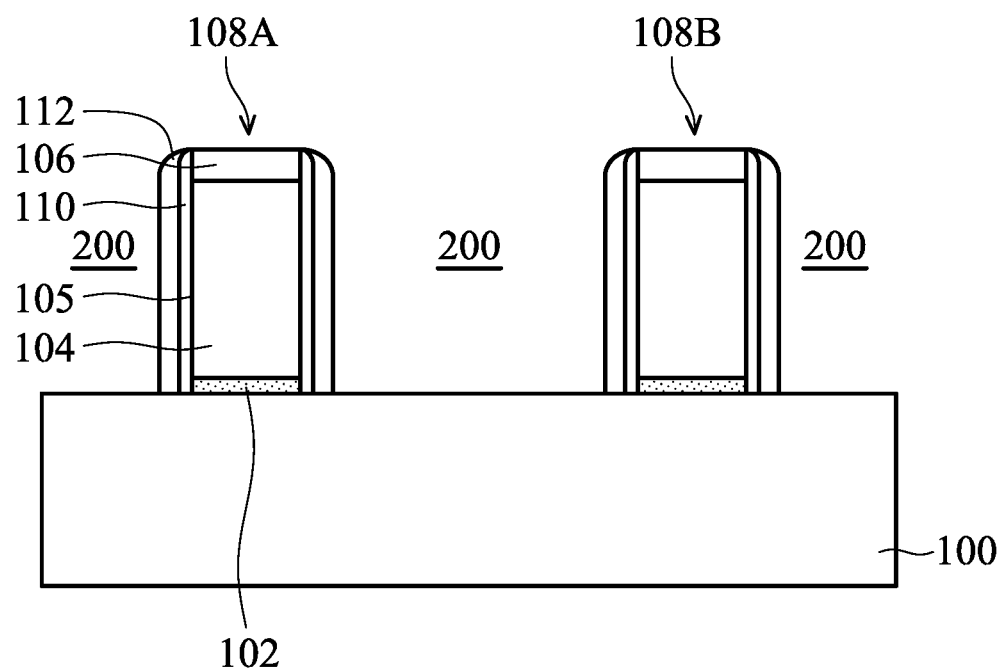

As shown in FIG. 1B, spacer elements 112 are formed over the sealing elements 110, in accordance with some embodiments. The spacer elements 112 may be used to protect the gate electrodes 104 from damage during subsequent process operations. The spacer elements 112 may also be used as a mask during a subsequent ion implantation operation. In some embodiments, each of the spacer elements 112 includes multiple sub-layers. These sub-layers may be made of the same material. Alternatively, some of the sub-layers may be made of different materials.

In some embodiments, the spacer elements 112 are made of a dielectric material. The dielectric material may include silicon nitride, silicon oxynitride, silicon oxide, another suitable material, or a combination thereof. In some embodiments, a spacer material layer is deposited over the gate stacks 108A and 108B, the sealing elements 110, and the semiconductor substrate 100. The spacer material layer may be deposited using a CVD process, an ALD process, a spin-on process, another applicable process, or a combination thereof. Afterwards, an etching process, such as a dry etching process, is performed to partially remove the spacer material layer. The remaining portions of the spacer material layer on the sealing elements 110 form the spacer elements 112, as shown in FIG. 1B.

Figure 1C:
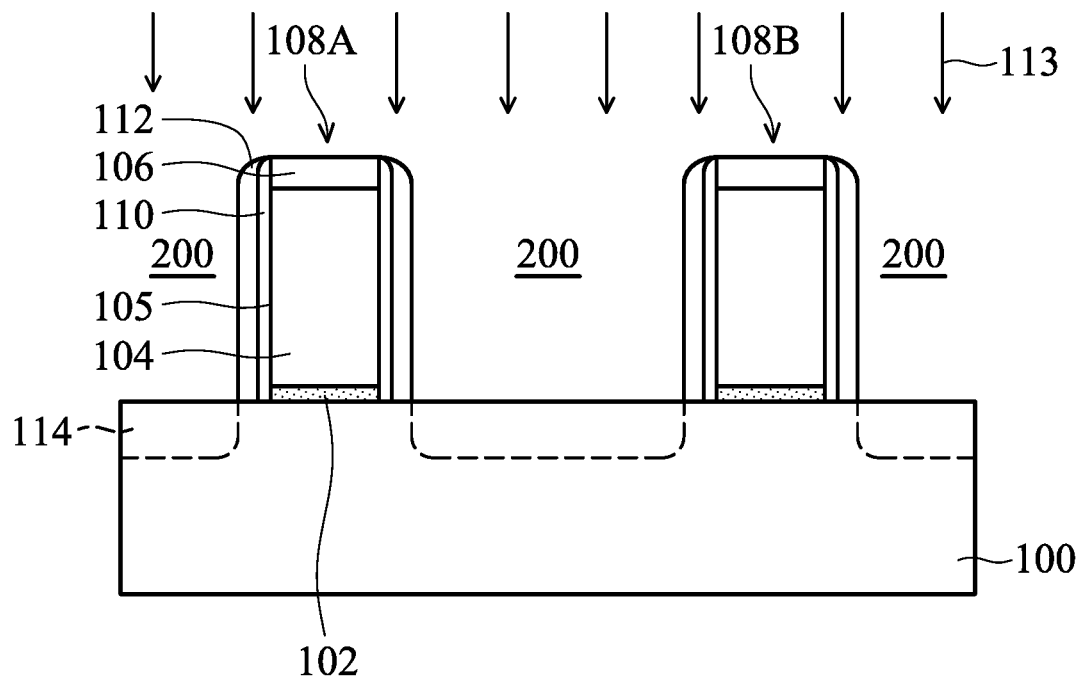

As shown in FIG. 1C, one or more ion implantation operations 113 are performed to form doped regions 114 in the semiconductor substrate 100, in accordance with some embodiments. The doped regions 114 may allow a subsequent recess formation process to be performed more easily. In some embodiments, dopants including arsenic (As) and/or another suitable dopant are implanted into the semiconductor substrate 100 to form the doped regions 114. The gate stacks 108A and 108B and the spacer elements 112 together serve as an implantation mask during the implantation process for forming the doped regions 114.

Many variations and/or modifications can be made to embodiments of the disclosure. In some embodiments, the doped regions 114 are not formed. In some other embodiments, both the doped regions 114 and the spacer elements 112 are not formed. In some other embodiments, the doped regions 114 are not formed, and the spacer elements 112 are formed.

Figure 1D:
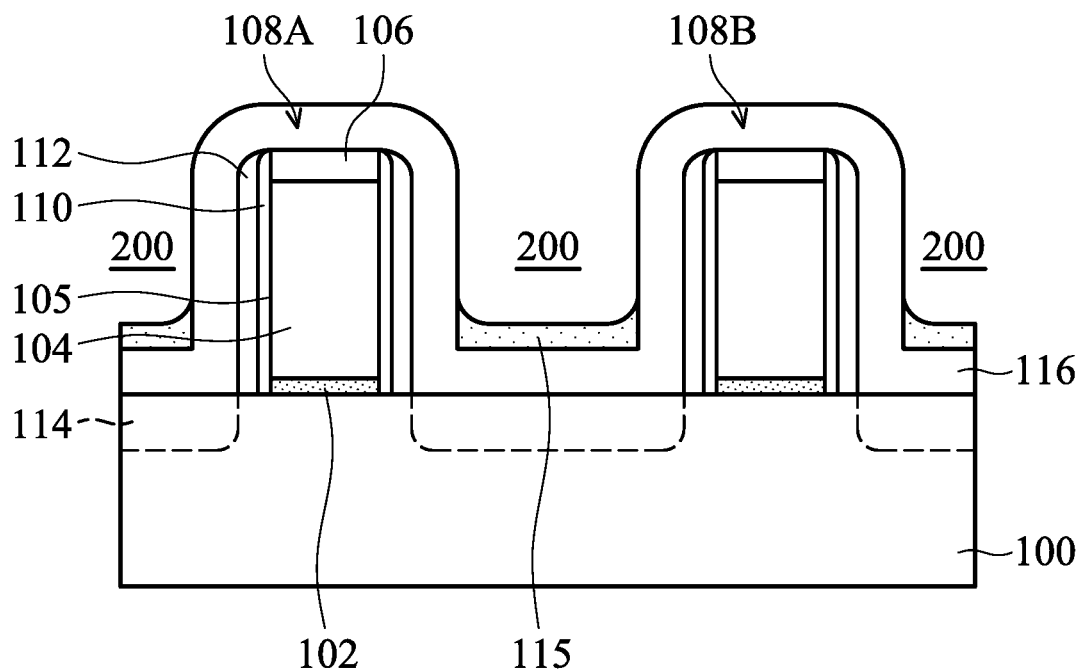

As shown in FIG. 1D, a spacer layer 116 is deposited over the semiconductor substrate 100, the spacer elements 112, and the gate stacks 108A and 108B, in accordance with some embodiments. In some embodiments, the spacer layer 116 is made of a dielectric material. The dielectric material may include silicon nitride, silicon oxynitride, silicon carbide, silicon carbon nitride, silicon oxide, another suitable material, or a combination thereof. In some embodiments, the spacer layer 116 is deposited using a CVD process, an ALD process, a spin-on process, another applicable process, or a combination thereof.

As shown in FIG. 1D, a protection material 115 is formed over the portions of the spacer layer 116 on bottoms of the recesses 200, in accordance with some embodiments. The protection material 115 may be used to control a subsequent patterning process of the spacer layer 116. In some embodiments, the protection material 115 is made of a carbon-containing layer. In some embodiments, the protection layer 115 is a remaining portion of an anti-reflection coating layer that is previously formed over the structure shown in FIG. 1D.

In some embodiments, an anti-reflection coating layer (a backside anti-reflection coating, BARC) and a patterned photoresist layer are formed over the semiconductor substrate 100 and the gate stacks. The patterned photoresist layer has one or more openings that expose the portions where subsequent processes will be performed. The other portions covered by the patterned photoresist layer are therefore protected. For example, the portions where n-type doped regions will be formed are covered, and the portions where p-type doped regions will be formed are not covered by the patterned photoresist layer. The anti-reflection coating layer under the photoresist layer may be used to assist in the photolithography process for patterning the photoresist layer. The anti-reflection coating layer may be a carbon-containing layer, such as a polymer layer or an inorganic layer that contains carbon.

In some embodiments, an etching process is performed afterwards to remove the portions of the anti-reflection coating layer exposed by the openings of the patterned photoresist layer. Therefore, subsequent processes can be performed on the exposed portions after the anti-reflection coating layer is partially removed. In some embodiments, the etching process is a plasma etching process which involves exciting a gas mixture to generate plasma for etching. In some embodiments, the gas mixture includes oxygen gas and hydrogen bromide gas. In some embodiments, the amount of the hydrogen bromide gas is modified such that the etching rate of the anti-reflection coating layer is retarded. For example, the amount of hydrogen bromide gas may be increased. As a result, after the etching process, the remaining portions of the anti-reflection coating layer on the bottoms of the recesses 200 form the protection material 115, as shown in FIG. 1D in accordance with some embodiments.

However, it should be appreciated that many variations and/or modifications can be made to embodiments of the disclosure. The formation method of the protection material 115 is not limited to the above-mentioned methods. In some other embodiments, the protection layer 115 is directly formed over the bottoms of the recesses 200 using a CVD process, a spin-on process, another applicable process, or a combination thereof. The protection material 115 is not limited to a carbon-containing material. In some other embodiments, the protection material 115 is made of silicon oxide, silicon oxynitride, silicon carbide, silicon carbon nitride, silicon nitride, another suitable material, or a combination thereof.

Figure 1E:
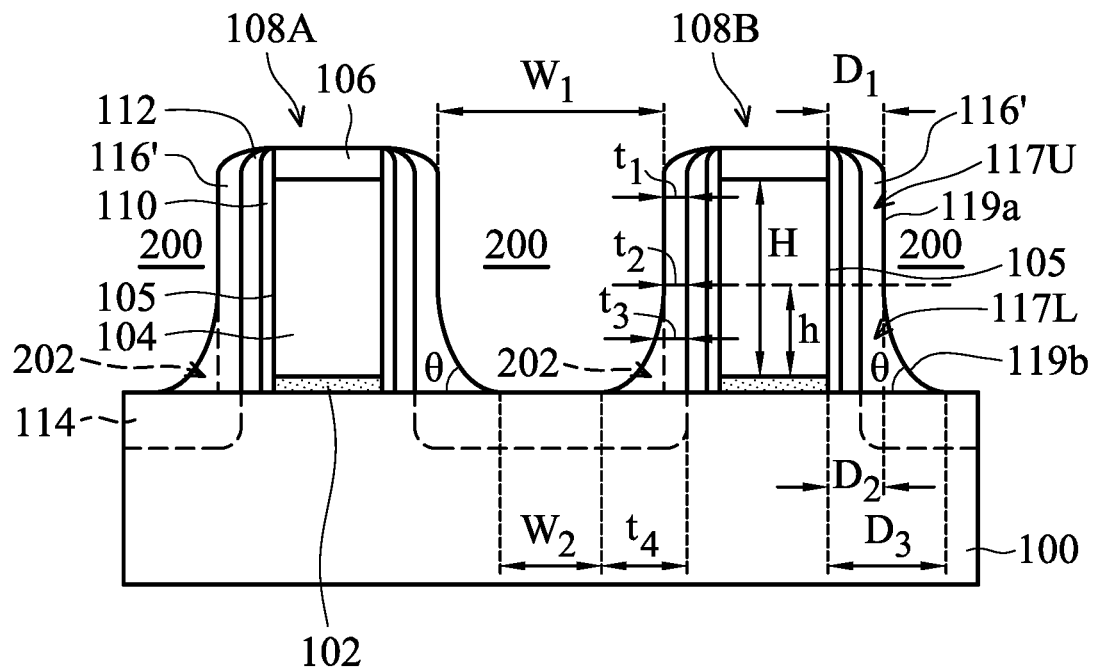

Afterwards, an etching process is performed to partially remove the spacer layer 116, as shown in FIG. 1E in accordance with some embodiments. The remaining portions of the spacer layer 116 over the spacer elements 112 form the spacer elements 116', as shown in FIG. 1E. Each of the spacer elements 116' includes an upper portion 117U and a lower portion 117L. In some embodiments, due to the protection material 115, the etching rate of the portions of the spacer layer 116 near the bottoms of the recesses 200 between the gate stacks is retarded. More material is remaining near the bottom of the recesses 200 such that the lower portion 117L has a protruding footing feature 202 and is wider than the upper portion 117U. The protection material 115 may be removed while the spacer layer 116 is etched to form the spacer elements 116'.

However, it should be appreciated that many variations and/or modifications can be made to embodiments of the disclosure. In some other embodiments, the protection material 115 is not formed. In some embodiments, the conditions of the etching process are fine-tuned such that the spacer elements 116' having the desired profile such as that shown in FIG. 1E are formed. For example, the compositions of the etchants are tuned.

As shown in FIG. 1E, the upper portion 117U and the lower portion 117L have an exterior surface 119a and an exterior surface 119b, respectively. In some embodiments, the exterior surface 119b of the lower portion 117L connects to the exterior surface 119a of the upper portion 117U. In some embodiments, the exterior surface 119a of the upper portion 117U is substantially parallel to the sidewall 105 of the gate electrode 104. In some embodiments, lateral distances between the exterior surface 119a of the upper portion 117U and the sidewall 105 of the gate electrode 104 are substantially the same. For example, the lateral distances are substantially equal to the distance D1, as shown in FIG. 1E. In some embodiments, the distance D1 is a maximum lateral distance between the upper portion 117U of the spacer elements 116' and the sidewall 105 of the gate electrode 104. In some embodiments, the distance D1 is in a range from about 1 nm to about 20 nm. In some other embodiments, the distance D1 is in a range from about 2 nm to about 10 nm.

In some embodiments, the exterior surface 119b of the lower portion 117L is a curved surface. In some embodiments, the exterior surface 119b curves inward, as shown in FIG. 1E. In some embodiments, lateral distances between the exterior surface 119b of the lower portion 117L of the spacer element 116' and the sidewall 105 of the gate electrode 104 increase along a direction from the top of the lower portion 117L towards the semiconductor substrate 100. In some embodiments, the lateral distances between the exterior surface 119b of the lower portion 117L and the sidewall 105 gradually increase along the direction from the top of the lower portion 117L towards the semiconductor substrate 100. For example, the lateral distances gradually increase from the distance D2 to the distance D3, as shown in FIG. 1E. In some embodiments, the distance D2 is equal to the distance D1. In some embodiments, the distance D2 is a lateral distance between a top of the lower portion 117L of the spacer elements 116' and the sidewall 105 of the gate electrode 104. In some embodiments, the distance D3 is a lateral distance between a bottom of the lower portion 117L of the spacer elements 116' and the sidewall 105 of the gate electrode 104. In some embodiments, the distance D2 is in a range from about 1 nm to about 20 nm. In some other embodiments, the distance D2 is in a range from about 2 nm to about 10 nm. In some embodiments, the distance D3 is in a range from about 2 nm to about 30 nm. In some embodiments, the distance D3 is in a range from about 5 nm to about 15 nm.

In some embodiments, a ratio of one of the lateral distances between the exterior surface 119b and the sidewall 105 to a lateral distance between the exterior surface 119a and the sidewall 105 is in a range from about 1.2 to about 2. In some embodiments, the ratio of the distance D3 to the distance D1 is in a range from about 1.2 to about 2.

In some embodiments, the thicknesses of the upper portion 117U are substantially the same, as shown in FIG. 1E. For example, the upper portion 117U of the spacer element 116' has a thickness t1. In some embodiments, the thickness of the lower portion 117L of the spacer element 116' is not uniform. In some embodiments, the thicknesses of the lower portion 117L increase along a direction from the top of the lower portion 117L towards the semiconductor substrate 100. In some embodiments, the thicknesses of the lower portion 117L gradually increase along a direction from the top of the lower portion 117L towards the semiconductor substrate 100. For example, the thickness gradually increases to a thickness t3 from a thickness t2. The thickness t3 gradually increases to a thickness t4, as shown in FIG. 1E in accordance with some embodiments. In some embodiments, the thickness t4 is greater than the thickness t1 by about 1 nm to about 3 nm. In some embodiments, the thickness t3 is substantially equal to the average value of the thicknesses t2 and t4. In some embodiments, the thickness t3 is the thickness of a middle portion of the lower portion 117L.

In some embodiments, the top of the lower portion 117L is as high as a height h of the gate electrode 104, and the height h is half of the total height H of the gate electrode 104. In some other embodiments, a ratio of the height h to the total height H of the gate electrode 104 (h/H) is in a range from about ⅛ to about ⅝. As shown in FIG. 1E, an angle θ is formed between the bottom of the spacer element 116' (or the protruding footing feature 202) and the exterior surface 119b. In some embodiments, the angle θ is in a range from about 1 degree to about 85 degrees. In some other embodiments, the angle θ is in a range from about 10 degrees to about 60 degrees.

As shown in FIG. 1E, after the spacer elements 116' are formed, each of the recesses 200 now has a bottom width W2 that is smaller than a top width W1. The bottom width W2 of the recess 200 is smaller because of the occupation of the lower portion 117L of the spacer element 116'. The protruding footing feature 202 covers a portion of the semiconductor substrate 100. Therefore, the bottom width W2 of the recess 200 is smaller. A subsequent recess formation process may be well-controlled due to the protruding footing feature 202. Meanwhile, the top width W1 of recess 200 remains large since the upper portion 117U of the spacer element 116' does not occupy too much space of the recess 200. Therefore, a subsequent dielectric material filling process may still be performed smoothly.

Figure 1F:
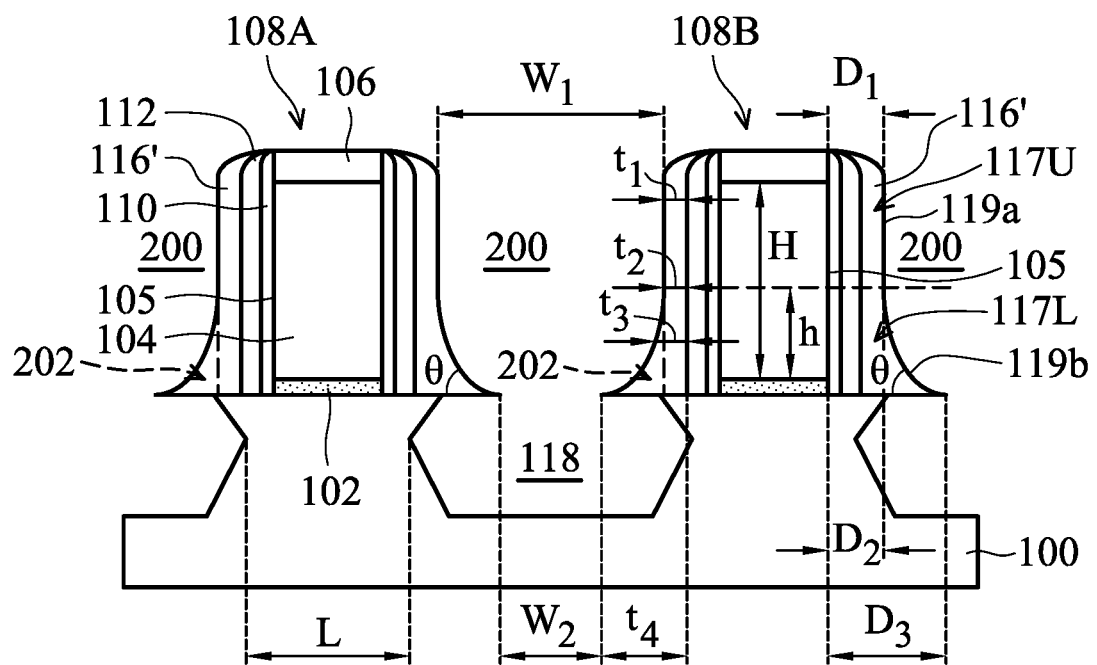

As shown in FIG. 1F, a portion of the semiconductor substrate 100 is removed to form recesses 118, in accordance with some embodiments. In some embodiments, one or more etching processes are performed to form the recesses 118. The spacer elements 116' may serve as an etching mask during the formation of the recesses 118. In some embodiments, the dopants in the doped regions 114 may react with the etchants in the etching processes. The profiles of the recesses 118 may therefore be controlled.

As shown in FIG. 1F, each of the recesses 118 laterally extends under the spacer element 116'. The region under the gate electrode 104 and between edges of the recesses 118 forms a channel region that has a channel length L. Because of the occupation of the lower portion 117L of the spacer element 116' (or the protruding footing feature 202), the bottom width of the recess 200 is shrunk. Therefore, the lateral extending degrees of the recesses 118 are limited since some of the etchants are blocked by the protruding footing feature 202. As a result, the channel region may have a sufficient channel length L, which greatly improves the device performance. In some other cases where the spacer element does not have the protruding footing feature, the channel region may accordingly have a shorter length. The performance may not as good as that of the device structure in accordance with some embodiments of the disclosure.

Figure 1G:
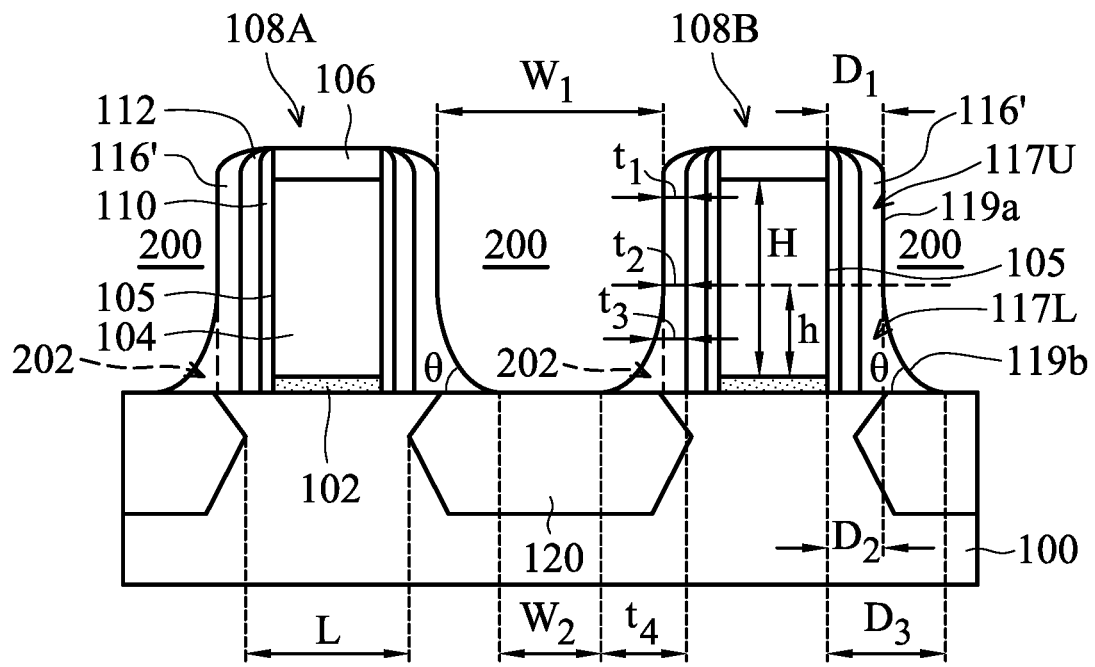

As shown in FIG. 1G, source/drain structures 120 are formed in the recesses 118 and over the semiconductor substrate 100, in accordance with some embodiments. In some embodiments, the protruding footing features 202 of the spacer elements 116' cover a portion of the source/drain structures 120, as shown in FIG. 1G. In some embodiments, the tops of the source/drain structures 120 are substantially coplanar with the top of the semiconductor substrate 100. However, embodiments of the disclosure are not limited thereto. In some other embodiments, the source/drain structures 120 are raised source/drain structures and protrude from the top of the semiconductor substrate 100. In some embodiments, the semiconductor substrate 100 shown in FIG. 1G is a fin structure. In these cases, the source/drain structures 120 serve as a source/drain region of a FinFET transistor.

In some embodiments, the source/drain structures 120 are formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, another applicable process, or a combination thereof.

In some embodiments, the source/drain structures 120 are doped with one or more suitable dopants. For example, the source/drain structures 120 are SiGe source/drain features doped with boron (B) or another suitable dopant. Alternatively, in some other embodiments, the source/drain structures 120 are Si source/drain features doped with phosphor (P), antimony (Sb), or another suitable dopant.

In some embodiments, the source/drain structures 120 are doped in-situ during their epitaxial growth. In some other embodiments, the source/drain structures 120 are not doped during the growth of the source/drain structures 120. Instead, after the formation of the source/drain structures 120, the source/drain structures 120 are doped in a subsequent process. In some embodiments, the doping is achieved by using an ion implantation process, a plasma immersion ion implantation process, a gas and/or solid source diffusion process, another applicable process, or a combination thereof. In some embodiments, the source/drain structures 120 are further exposed to one or more annealing processes to activate the dopants. For example, a rapid thermal annealing process is used.

Figure 1H:
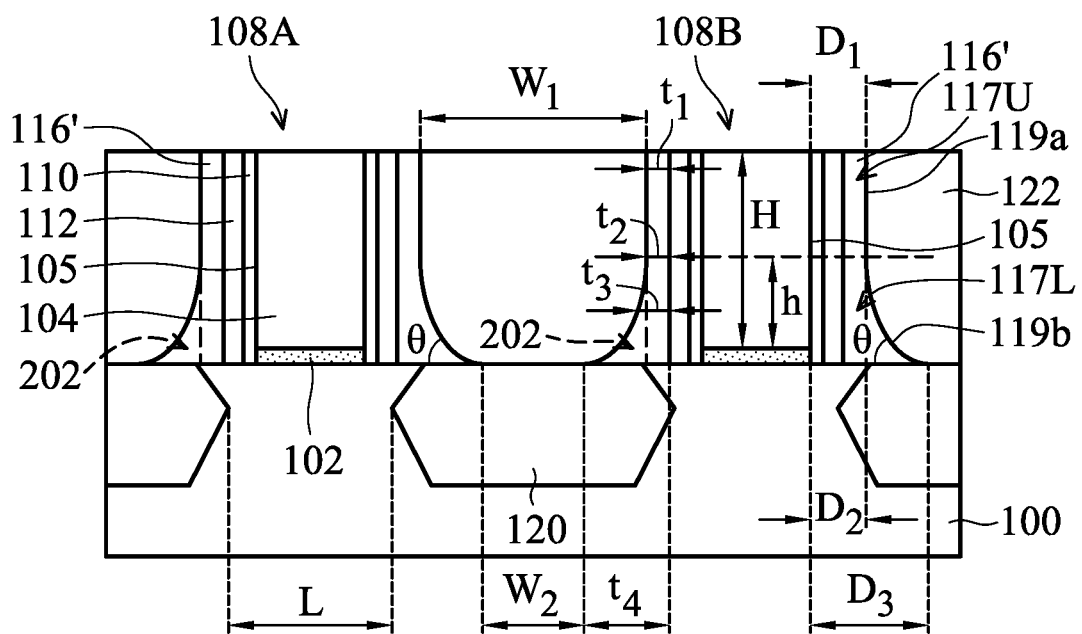

As shown in FIG. 1H, a dielectric layer 122 is formed over the spacer elements 116', the gate stacks 108A and 108B, and the source/drain structures 120 to fill the recesses 200, in accordance with some embodiments. The dielectric layer 122 surrounds the spacer elements 116' and the gate electrode 104. Because of the spacer element 116' having the protruding footing feature 202, a channel region that has a sufficient length is obtained. As mentioned above, the top width $W_1$ of the recess 200 is still wide enough to allow a good filling of the dielectric layer 122. The upper portion 117L of the spacer element 116' is thin enough such that the top width W1 of the recess 200 is still wide enough. The filling of the dielectric layer 122 may therefore be performed more easily.

Afterwards, a planarization process is performed to thin the dielectric layer 122 until the gate electrodes 104 are exposed, as shown in FIG. 1H in accordance with some embodiments. The planarization process may include a chemical mechanical polishing (CMP) process, an etching process, a grinding process, another applicable process, or a combination thereof. In some embodiments, the hard mask 106 is also removed during the planarization process.

As mentioned above, the ratio of the distance D3 to the distance D1 is in a range from about 1.2 to about 2, in accordance with some embodiments. In some cases, if the ratio (D3/D1) is smaller than about 1.2, the distance D3 may be too small. As a result, the channel length L may not be sufficient. Alternatively, the distance D1 may be too long such that the filling of the dielectric layer 122 may be difficult to perform. In some other cases, if the ratio (D3/D1) is higher than about 2, the distance D3 may be too long. As a result, the lateral extending degree of the recesses 118 may not be enough. The source/drain structure 120 may not be able to provide enough strain to increase the carrier mobility.

Figure 1I:
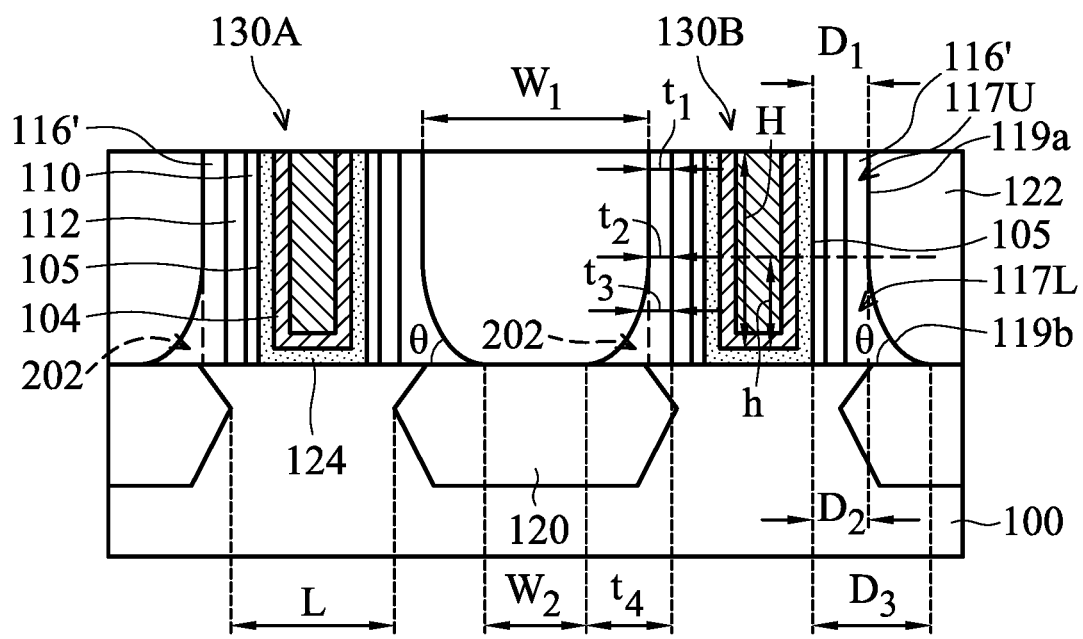

As shown in FIG. 1I, the gate dielectric layer 102 and the gate electrodes 104 are respectively replaced with a gate dielectric layer 124 and metal gate electrodes 130A and 130B, in accordance with some embodiments. In some embodiments, the gate electrode 104 and the dielectric layer 102 are removed sequentially using one or more etching processes to form recesses between the sealing elements 110.

Afterwards, the gate dielectric layer 124 is deposited over the dielectric layer 122 and the sidewalls and bottoms of the recesses between the sealing elements 110. In some embodiments, the gate dielectric layer 124 is a high-k dielectric layer. The high-k dielectric layer may be made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 124 is deposited using an ALD process or another applicable process. In some embodiments, a high temperature annealing operation is performed to reduce or eliminate defects in the gate dielectric layer 124.

In some other embodiments, before the gate dielectric layer 124 is formed, an interfacial layer (not shown) is formed in the recesses between the sealing elements 110. The interfacial layer may be used to reduce stress between the gate dielectric layer 124 and the semiconductor substrate 100. In some embodiments, the interfacial layer may be made of silicon oxide. In some embodiments, the interfacial layer is formed using an ALD process, a thermal oxidation process, another applicable process, or a combination thereof.

Afterwards, a work function layer 126 is deposited over the gate dielectric layer 124, as shown in FIG. 1I in accordance with some embodiments. In some embodiments, the work function layer 126 includes multiple sub-layers. In some embodiments, these sub-layers are made of different materials. In some other embodiments, these sub-layers are made of the same material. The work function layer 126 is used to provide desired work function for transistors to enhance device performance including improved threshold voltage. In the embodiments of forming an NMOS transistor, the work function layer 126 can be an n-type metal layer capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, other suitable materials, or a combination thereof.

On the other hand, in the embodiments of forming a PMOS transistor, the work function layer 126 can be a p-type metal layer capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 126 may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 126 may be tuned to adjust the work function level. For example, a titanium nitride layer may be used as a p-type metal layer or an n-type metal layer, depending on the thickness and/or the compositions of the titanium nitride layer.

In some embodiments, a barrier layer (not shown) is deposited over the gate dielectric layer 124, before the work function layer 126 is deposited. The barrier layer may be used to interface the gate dielectric layer 124 with the work function layer 126. The barrier layer may also be used to prevent diffusion between the gate dielectric layer 124 and the work function layer 126. In some embodiments, the barrier layer is made of a metal-containing material. The metal-containing material may include titanium nitride, tantalum nitride, other suitable materials, or a combination thereof. In some embodiments, the barrier layer includes multiple layers. In some embodiments, the barrier layer is deposited using an ALD process, a physical vapor deposition (PVD) process, a plating process, other applicable processes, or a combination thereof. In some other embodiments, the barrier layer is not formed.

Afterwards, a metal filling layer 128 is deposited over the work function layer 126 to fill the recesses between the sealing elements 110, as shown in FIG. 1I in accordance with some embodiments. In some embodiments, the metal filling layer 128 is made of aluminum, tungsten, copper, another suitable material, or a combination thereof. In some embodiments, the metal filling layer 128 is deposited using a PVD process, a plating process, a CVD process, another applicable process, or a combination thereof.

Afterwards, a planarization process is performed to remove the portions of the gate dielectric layer 124, the work function layer 126, and the metal filling layer 128 outside of the recesses between the sealing elements 110, as shown in FIG. 1I in accordance with some embodiments. The remaining portions of the work function layer 126 and the metal filling layer 128 together form the metal gate electrodes 130A and 130B, as shown in FIG. 1I. The planarization process may include a CMP process, a grinding process, an etching process, another applicable process, or a combination thereof.

Many variations and/or modifications can be made to embodiments of the disclosure. In some embodiments, the top of the spacer element 116 is as high as the tops of the metal gate electrode 130A and 130B, as shown in FIG. 1I. However, embodiments of the disclosure are not limited thereto. In some embodiments, the spacer element 116' does not reach the top of the spacer element 112. In these cases, the spacer element 116' is lower than the tops of the metal gate electrodes 130A and 130B.

Embodiments of the disclosure form spacer element that includes a protruding footing feature. Due to the protruding footing feature, the channel length under the gate electrode can be controlled according to requirements. The upper portion of the spacer element is thin and does not occupy too much space between gate stacks. Therefore, a subsequent deposition of a dielectric layer between the gate stacks can be performed smoothly. The reliability and performance of the device structure are improved significantly.

In accordance with some embodiments, a semiconductor device structure is provided. The semiconductor device structure includes a semiconductor substrate and a gate electrode over the semiconductor substrate. The semiconductor device structure also includes a source/drain structure adjacent to the gate electrode. The semiconductor device structure further includes a spacer element over a sidewall of the gate electrode, and the spacer element has an upper portion having a first exterior surface and a lower portion having a second exterior surface. Lateral distances between the first exterior surface and the sidewall of the gate electrode are substantially the same. Lateral distances between the second exterior surface and the sidewall of the gate electrode increase along a direction from a top of the lower portion towards the semiconductor substrate.

In accordance with some embodiments, a semiconductor device structure is provided. The semiconductor device structure includes a semiconductor substrate and a gate electrode over the semiconductor substrate. The semiconductor device structure also includes a source/drain structure over the semiconductor substrate and adjacent to the gate electrode. The semiconductor device structure further includes a spacer element over a sidewall of the gate electrode. The spacer element has a protruding footing feature, and the protruding footing feature covers a portion of the source/drain structure.

In accordance with some embodiments, a method for forming a semiconductor device structure is provided. The method includes forming a gate electrode over a semiconductor substrate and forming a spacer element over a sidewall of the gate electrode. The spacer element has a protruding footing feature. The method also includes forming a recess in the semiconductor substrate, and the recess extends laterally under the spacer element. The method further includes forming a source/drain structure in the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a gate electrode over a substrate;
    forming a spacer element over a sidewall of the gate electrode, wherein forming the spacer element comprises:
        forming a spacer layer over the substrate and over the gate electrode, the spacer layer having a horizontal portion extending along an upper surface of the substrate, and a vertical portion extending along the sidewall of the gate electrode;
        after forming the spacer layer, forming a protection material on the horizontal portion of the spacer layer, the protection material contacting the vertical portion of the spacer layer; and
        etching the spacer layer using an anisotropic etching process, wherein after the anisotropic etching process, the protection material is removed, and a remaining portion of the spacer layer along the sidewall of the gate electrode forms the spacer element;
    forming a recess in the substrate, wherein the recess extends laterally under the spacer element; and
    forming a source/drain structure in the recess.

2. The method of claim 1, wherein etching the spacer layer comprises etching the spacer layer using a single anisotropic etching process.

3. The method of claim 1, wherein the horizontal portion and the vertical portion of the spacer layer form a continuous spacer layer that extends along the upper surface of the substrate and along the sidewall of the gate electrode.

4. The method of claim 1, wherein an upper surface of the protection material distal the substrate is closer to the substrate than an upper surface of the gate electrode distal the substrate.

5. The method of claim 1, wherein forming the protection material comprises forming the protection material using a carbon-containing material.

6. The method of claim 5, wherein the carbon-containing material is a carbon-containing polymer layer or a carbon-containing inorganic layer.

7. The method of claim 1, wherein forming the protection material comprises forming the protection material using silicon oxide, silicon oxynitride, silicon carbide, silicon carbon nitride, silicon nitride, or combinations thereof.

8. The method of claim 1, wherein the spacer element is formed to have an upper portion and a lower portion between the upper portion and the substrate, wherein the upper portion of the spacer element has a substantially uniform thickness, and a thickness of the lower portion of the spacer element gradually increases as the lower portion of the spacer element extends towards the substrate.

9. The method of claim 8, wherein the lower portion of the spacer element has a first thickness at an interface between the upper portion and the lower portion of the spacer element, and has a second thickness at an interface between the substrate and the lower portion of the spacer element, wherein a ratio of the second thickness to the first thickness is between about 1.2 and about 2.

10. The method of claim 1, wherein a lower surface of the spacer element closest to the substrate extends along an upper surface of the source/drain structure.

11. The method of claim 1, wherein the source/drain structure is formed to have an upper surface that is level with the upper surface of the substrate.

12. A method of forming a semiconductor device, the method comprising:
    forming a first gate structure and a second gate structure over a substrate, the second gate structure adjacent to the first gate structure;
    forming a spacer layer over the first gate structure, the second gate structure, and the substrate;
    forming a protection layer between the first gate structure and the second gate structure and on the spacer layer, wherein an upper surface of the protection layer distal the substrate is closer to the substrate than an upper surface of the first gate structure;
    performing an anisotropic etching process to remove portions of the spacer layer and to remove the protection layer, wherein after the anisotropic etching process, remaining portions of the spacer layer form spacer elements extending along sidewalls of the first gate structure and along sidewalls of the second gate structure, wherein each of the spacer elements has an upper portion and a lower portion, the upper portion having a substantially uniform thickness, and the low portion having a protruding footing feature;

forming a recess in the substrate between the first gate structure and the second gate structure; and forming a source/drain material in the recess.

13. The method of claim 12, wherein the protection layer is a carbon-containing material.

14. The method of claim 12, wherein forming the protection layer comprises:

forming a protection material over the first gate structure, the second gate structure, and the substrate;

forming a patterned mask layer over the protection material; and performing a plasma etching process to remove portions of the protection material exposed by the patterned mask layer, wherein remaining portions of the protection material after the etching process form the protection layer.

15. The method of claim 14, wherein the plasma etching process uses a gas mixture comprising oxygen gas and hydrogen bromide gas.

16. The method of claim 15, further comprising adjusting an etching rate of the protection material by changing an amount of the hydrogen bromide gas in the gas mixture.

17. The method of claim 12, wherein the recess is formed to extend laterally under the spacer elements.

18. A method of forming a semiconductor device, the method comprising:

forming a gate electrode over an upper surface of a substrate;

forming a spacer element that extends along a sidewall of the gate electrode from a top surface of the gate electrode to the substrate, the spacer element having an upper portion and a lower portion between the upper portion and the substrate, wherein a thickness of the upper portion of the spacer element is substantially uniform, and a thickness of the lower portion of the spacer element gradually increases as the lower portion of the spacer element extends towards the substrate; and forming a source/drain structure in the substrate adjacent to the gate electrode, wherein a lower surface of the spacer element extends along the upper surface of the substrate and along an upper surface of the source/drain structure.

19. The method of claim 18, wherein the source/drain structure is formed to has a first width measured at the upper surface of the substrate, a second width measured at a lower surface of the source/drain structure in the substrate, and a third width measured between the upper surface of the substrate and the lower surface of the source/drain structure, wherein the third width is larger than the first width and the second width.

20. The method of claim 18, wherein forming the source/drain structure comprises:

forming a recess in the substrate by performing an etching process using the spacer element as an etching mask, wherein the recess extends laterally under the spacer element; and forming a source/drain material in the recess.

* * * * *